(12) United States Patent
Gomes et al.

(10) Patent No.: US 12,532,480 B2
(45) Date of Patent: Jan. 20, 2026

(54) EMBEDDED MEMORY WITH DOUBLE-WALLED FERROELECTRIC CAPACITORS

(71) Applicant: Intel Corporation, Santa Clara, CA (US)

(72) Inventors: Wilfred Gomes, Portland, OR (US); Abhishek Anil Sharma, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 17/558,429

(22) Filed: Dec. 21, 2021

(65) Prior Publication Data

US 2023/0200082 A1    Jun. 22, 2023

(51) Int. Cl.
| | |
|---|---|
| *H10B 53/30* | (2023.01) |
| *H10B 53/40* | (2023.01) |
| *H10D 1/68* | (2025.01) |
| *H10D 30/67* | (2025.01) |

(52) U.S. Cl.
CPC ............. *H10B 53/30* (2023.02); *H10B 53/40* (2023.02); *H10D 1/716* (2025.01); *H10D 30/6755* (2025.01)

(58) Field of Classification Search
CPC ........ H10B 53/30; H10B 53/40; H10D 1/716; H10D 30/6755
See application file for complete search history.

(56) References Cited

U.S. PATENT DOCUMENTS

| | | | | |
|---|---|---|---|---|
| 2012/0235274 | A1* | 9/2012 | Doyle | H10D 1/716 438/386 |
| 2020/0286686 | A1* | 9/2020 | Lin | H10B 12/30 |
| 2020/0373381 | A1* | 11/2020 | Radosavljevic | H10D 1/684 |
| 2021/0320026 | A1* | 10/2021 | Or-Bach | H10B 12/50 |
| 2021/0408002 | A1* | 12/2021 | LaJoie | H10B 12/36 |
| 2021/0408021 | A1* | 12/2021 | Young | H10B 53/30 |
| 2022/0013356 | A1* | 1/2022 | Li | H10D 30/0323 |
| 2023/0197135 | A1* | 6/2023 | Gomes | H10B 53/40 365/145 |
| 2023/0197654 | A1* | 6/2023 | Gomes | H01L 25/0657 257/296 |

* cited by examiner

*Primary Examiner* — David Vu
*Assistant Examiner* — Brandon C Fox
(74) *Attorney, Agent, or Firm* — Essential Patents Group, LLP

(57) ABSTRACT

Integrated circuits with embedded memory that includes double-walled ferroelectric capacitors over an array of access transistors. Capacitor access transistors may be recessed channel array transistors (RCATs) implemented in a monocrystalline material that has been transferred from a donor wafer, or implemented in an amorphous or polycrystalline semiconductor material that has been deposited, such as a metal oxide semiconductor.

13 Claims, 12 Drawing Sheets

EMBEDDED MEMORY WITH DOUBLE-WALLED FERROELECTRIC CAPACITORS

BACKGROUND

Embedded memory is monolithically integrated into host integrated circuitry (i.e., both memory and the host circuitry fabricated on the same die or chip). One embedded memory architecture is DRAM based on a 1T-1C cell that includes a "write," "select" or "access" transistor and a storage capacitor. An array of such bit-cells may be integrated with host logic circuitry, such as a host microprocessor chip (e.g., a central processing unit or "CPU" core). Integration of both a capacitor memory device and a processor proximate to one another in a same IC chip, for example, enables communication between the memory device and the processor through a chip bus capable of higher bandwidths and/or lower signal latencies relative to packaged IC chips communicating through package interconnects.

A transistor and a capacitor of each 1T-1C cell may be electrically coupled through one or more metal interconnect layers formed in the back-end-of-line (BEOL) over logic circuitry formed in the front-end-of-line (FEOL). The BEOL is the portion of IC fabrication where individual semiconductor devices (whether embedded memory or logic transistors) are interconnected to one another with metal interconnect traces (lines) within a given metallization level and metal vias between multiple metallization levels. These conductive interconnects are embedded in a dielectric material so that the memory device is a monolithic integrated circuit.

In conventional embedded DRAM (eDRAM), each capacitor comprises an insulative dielectric material separating charge stored on capacitor conductors. An embedded memory architecture may rely on the application of a voltage to one capacitor conductor with the other conductor held at some reference (e.g., ground). In a ferroelectric embedded DRAM (FeDRAM), each capacitor comprises a ferroelectric material. An embedded memory architecture may then rely on polarization states of a capacitor's ferroelectric material, which can be changed when an electric field applied across the capacitor conductors is of correct polarity and sufficient strength to alter the semi-permanent dipoles within the ferroelectric material. A given polarization state may be sensed by measuring an amount of charge needed to flip the ferroelectric capacitor to an opposite polarity state. The read cell may then be subsequently rewritten to the previous polarization state to retain the ascertained bit value. An embedded FeDRAM memory architecture therefore needs to apply a voltage to each capacitor conductor relative to the other to sense and rewrite an individual bit-cell.

FeDRAM architectures, and fabrication techniques associated with those architectures, that are capable of supporting higher voltage operation and/or reduced transistor leakage are commercially advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
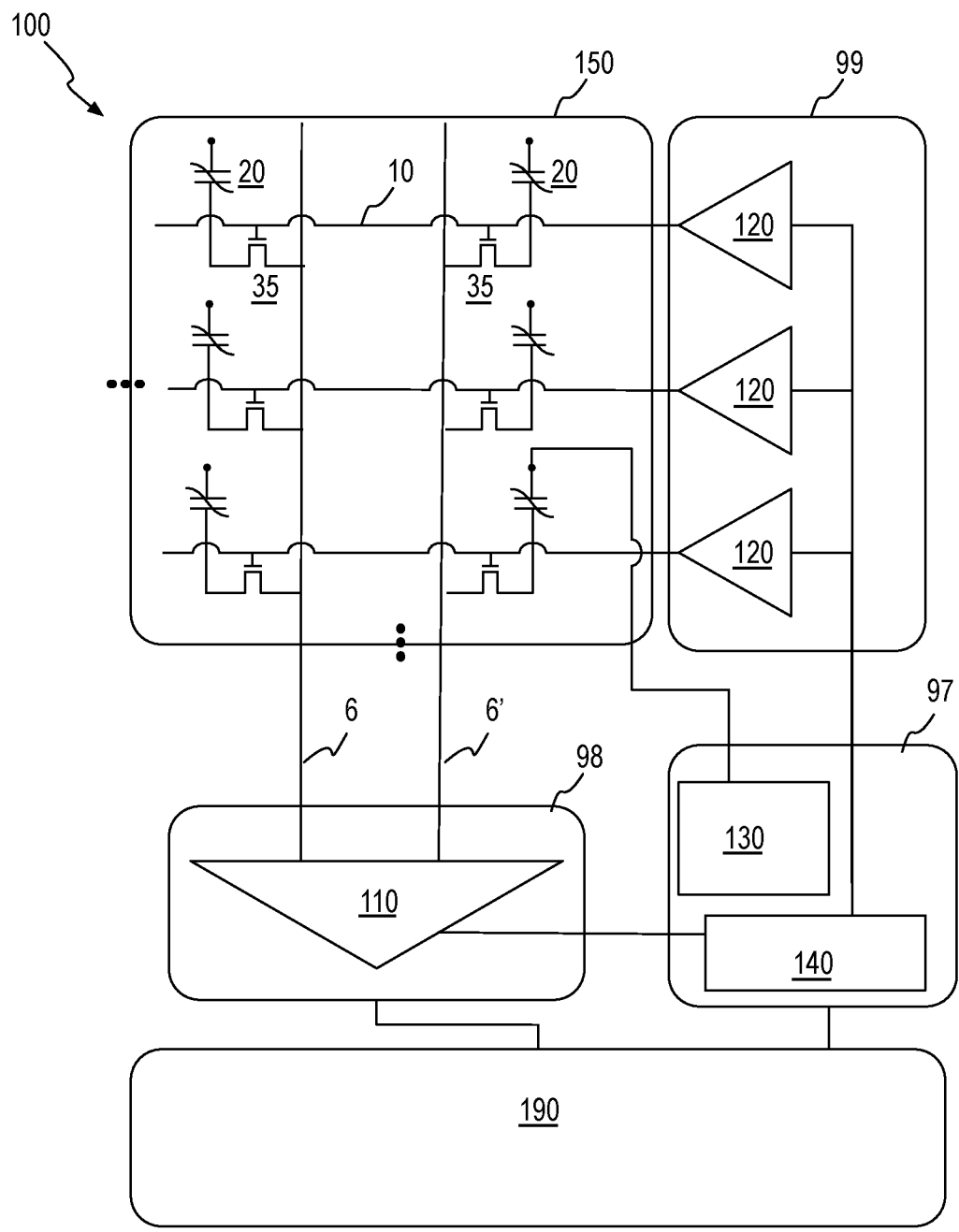
FIG. 1 illustrates a schematic of an integrated circuit (IC) with embedded memory including double-walled ferroelectric (FE) capacitors, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The term "adjacent" here generally refers to a position of a thing being next to (e.g., immediately next to or close to with one or more things between them) or adjoining another thing (e.g., abutting it).

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

The term "signal" may refer to at least one current signal, voltage signal, magnetic signal, or data/clock signal.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

As used throughout this description, and in the claims, a list of items joined by the term "at least one of" or "one or more of" can mean any combination of the listed terms.

Unless otherwise specified in the explicit context of their use, the terms "substantially equal," "about equal" or "approximately equal" mean that there is no more than incidental variation between two things so described. In the art, such variation is typically no more than +/−10% of a predetermined target value.

FIG. 1 is a schematic illustrating an IC 100 with embedded memory, in accordance with some embodiments. In this macro-view, a memory array 150 includes a 2D array of storage capacitors 20 networked with conductive traces including bitlines 6 and 6' (reference), as well as wordlines 10. Memory array 150 further includes a select/access transistor 35 electrically coupled to each storage capacitor 20. Memory array 150 is fabricated in the BEOL interconnect levels of IC 100. Hence, all of capacitors 20, bitlines 6, 6', wordlines 10, and select transistors 35 are fabricated within, and/or between, various interconnect metallization levels.

Peripheral memory circuitry including at least one of column circuitry 98 and row circuitry 99 may be located at a device level that falls within at least some of the footprint of memory array 150. For example, bitlines 6, 6' may be electrically coupled to a sense amplifier 110 employing MOSFETs fabricated in a region of a monocrystalline semiconductor device layer (e.g., silicon substrate) that is at least partially underlying memory array 150. In further embodiments, wordlines 10 are electrically coupled to wordline drivers 120 that employ MOSFETs fabricated in a region of a monocrystalline semiconductor device layer (e.g., silicon substrate) that is at least partially underlying memory array 150.

Peripheral memory circuitry further includes control circuitry 97. One or more of column circuitry 98, and/or row circuitry 99, and/or memory array 150 may be electrically coupled to control circuitry 97. Control circuitry 97 may include, for example, various voltage biasing circuits, such as capacitor bias circuitry 130. Control circuitry 97 may also include, for example, various memory management circuitry, such as control logic 140 communicatively coupled into column circuitry 98 and row circuitry 99 so as to permit coordinated operation of sense amplifier 110 and wordline driver 120. Control circuitry 97 may also be fabricated in a device level the falls within the footprint of memory array 150. Control circuitry 97 may, for example, also employ MOSFETs fabricated in a region of a monocrystalline semiconductor device layer (e.g., silicon substrate) that is at least partially underlying memory array 150.

IC 100 further includes host logic circuitry 190. Host logic circuitry 190 is a primary consumer of memory bandwidth supplied by memory array 150. Host logic circuitry 190 may be any application specific IC (ASIC) including one or more IP cores. In some embodiments, host logic circuitry 190 comprises a processor core. In other embodiments, host logic circuitry 190 comprises any of a wireless radio circuit, or floating point gate array (FPGA).

In exemplary embodiments, memory array 150 comprises a 2D array of metal-ferroelectric-metal (MFM) capacitors 20 fabricated over a corresponding array of the access transistors 35. In exemplary embodiments, the individual memory cells/bit-cells include one access transistor 35 and one ferroelectric capacitor 20 (1T-1F). Ferroelectric materials can have much higher values of relative permittivity than dielectric materials. Charge capacitance for a given MFM capacitor area may therefore be larger for a ferroelectric insulator than for a dielectric insulator. Accordingly, thickness of the ferroelectric material may be made larger for a given capacitance target and charge leakage accordingly reduced, or a capacitor of given ferroelectric thickness may be operated at higher voltage, storing more charge. The ferroelectric material may be deposited by chemical vapor deposition, and more specifically atomic layer deposition (ALD), at temperatures compatible with BEOL structures. The conformality of this technique also enables the formation of double walled ferroelectric capacitors 20.

Double-walled FE-capacitors 20 may occupy a footprint over a substrate including logic circuitry including field effect transistors (FETs), for example implementing the peripheral circuitry as described above. CMOS FET circuitry implementing host logic circuitry 190 may be adjacent to the footprint of memory array 150. Access transistors 35 providing wordline and bitline access to the FE-capacitors may reside within the BEOL substantially within the footprint of the FE-capacitor array.

For some exemplary embodiments, access transistor 35 of a 1T-1F storage cell is a thin-film transistor (TFT) rather than a monocrystalline silicon-based transistor (e.g., MOSFET). TFTs are a class of field-effect transistors (FETs) in which the channel material is a deposited thin film rather than a monocrystalline material. The thin film deposition processes employed in TFT fabrication can be relatively low temperature (e.g., below 450° C.), allowing TFTs to be inserted within layers of interconnect metallization of the type that is typically formed only after higher-temperature processing is completed in conventional silicon MOSFET fabrication technology. TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO), indium zinc oxide (IZO), and the like.

In accordance with some embodiments, the access transistor 35 of a 1T-1F storage cell is a recessed channel array transistor (RCAT). RCATs are a class of field-effect transistors (FETs) in which the gate is recessed into the channel material. Recession into the channel increases the effective channel length of the transistor without increasing the transistor footprint, allowing access transistor 35 to have an area matched to that of an overlying (double-walled) ferroelectric capacitor 20. With the longer channel for a given transistor footprint (area) off-state leakage can be reduced relative to a transistor occupying comparable area with a planar or fin architecture. Any reduction in switching speed associated with longer channel lengths places few, if any, constraints on memory array 150 assuming the amount of recess is properly tuned.

In some embodiments, RCATs is implemented in a thin film semiconductor material, enabling the RCATs to be fabricated at low temperatures as a species of the TFT class. In other embodiments, the RCATs are implemented in a monocrystalline semiconductor material. For such embodiments, the monocrystalline semiconductor material may be directly bonded (e.g., at the wafer level) to a planarized BEOL interconnect level. Any high temperature processing of the RCAT may be performed prior to the bonding. Following the bonding, (double-walled) ferroelectric capacitors 20 may be fabricated over the access transistors and at temperatures compatible with metal interconnect levels.

Figure 2:
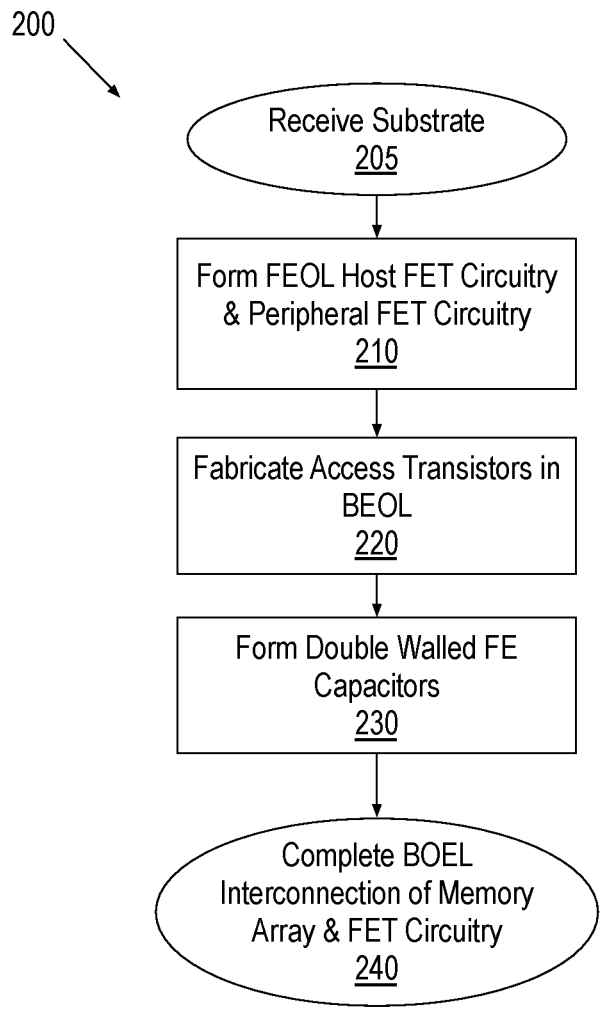
FIG. 2 is a flow diagram illustrating methods of fabricating the IC illustrated in FIG. 1, in accordance with some embodiments.
Figure 3A:
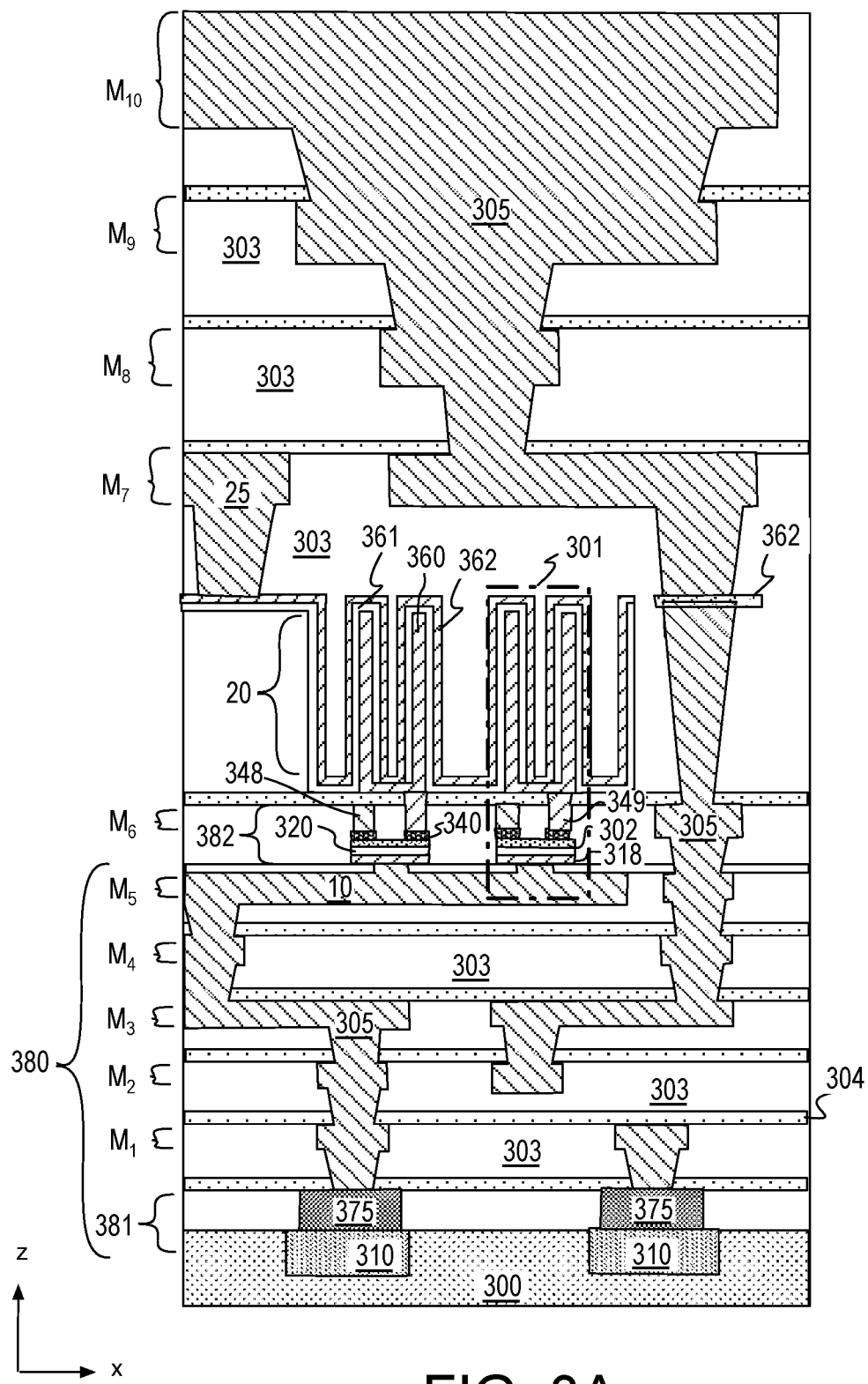
FIG. 3A illustrates a first cross-sectional side view of the IC illustrated in FIG. 1, in accordance with some exemplary embodiments with a thin film transistor (TFT) in the bit-cell.
Figure 3B:
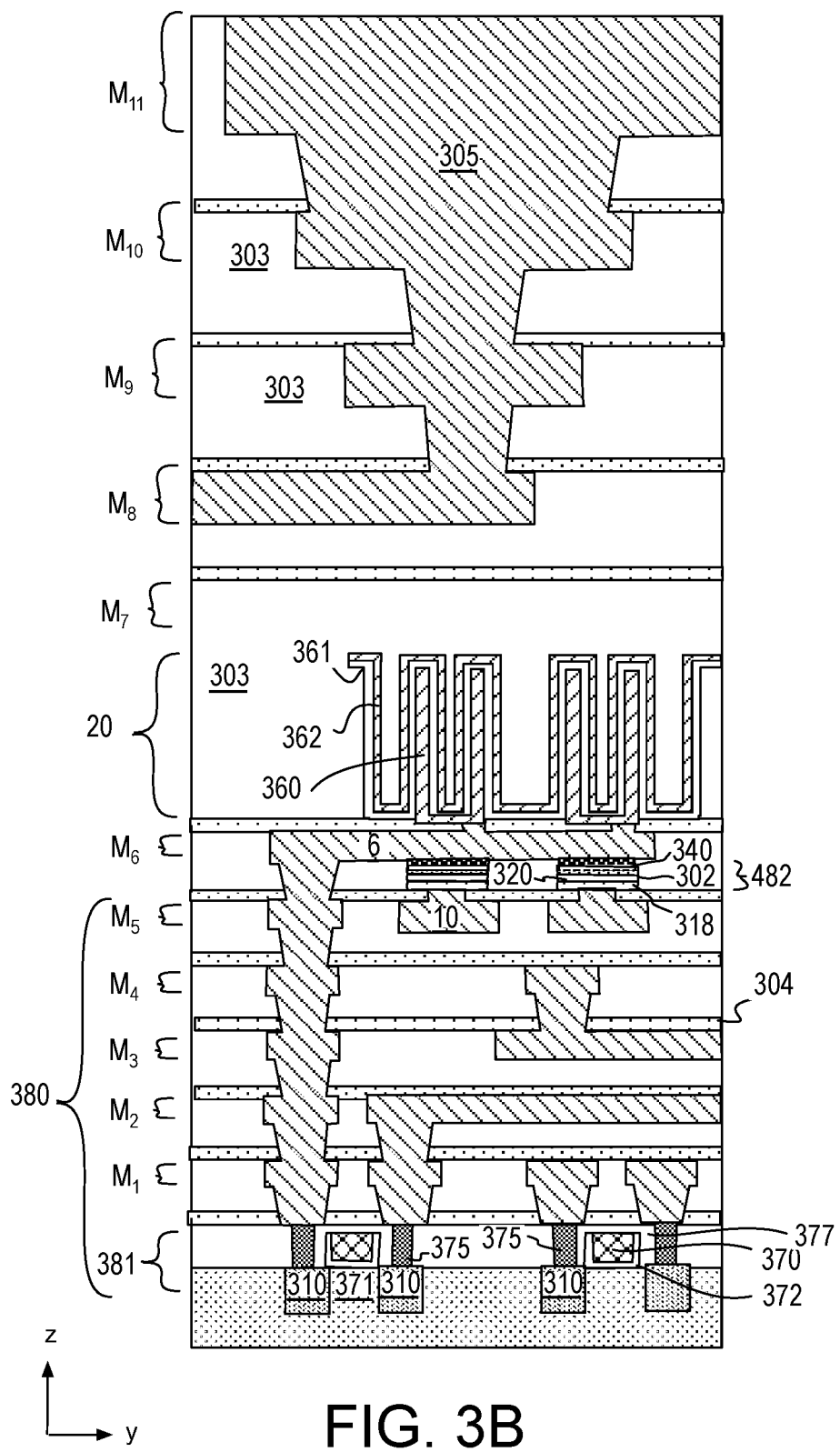
FIG. 3B illustrates a second, orthogonal cross-sectional side view of the IC illustrated in FIG. 3A, in accordance with some exemplary embodiments with a thin film transistor (TFT) in the bit-cell.

FIG. 2 is a flow diagram illustrating methods 200 for fabricating IC 100 (FIG. 1), in accordance with some embodiments. FIG. 3A and FIG. 3B illustrates two, orthogonal, cross-sectional side views of an IC structure that may be fabricated according to methods 200. The illustrated IC structure is an exemplary implementation of IC 100 in accordance with some embodiments having a thin film transistor (TFT) in the bit-cell. As shown in FIG. 2, methods 200 begin at input 205 where an input substrate is received. FIG. 3A, 3B illustrate an example where the input substrate 300 comprises a monocrystalline semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, substrate 300 is a Group III-N material comprising a Group III majority constituent and nitrogen as a majority constituent (e.g., GaN, InGaN). Other embodiments are also possible, for example where substrate 300 is a Group III-V material comprising a Group III majority constituent and a Group IV majority constituent (e.g., InGaAs, GaAs, GaSb, InGaSb).

Returning to FIG. 2, methods 200 continue at block 210 where FEOL fabrication processes are practiced to form host (e.g., ASIC) logic circuitry and embedded memory peripheral FET circuitry. Any FEOL process(es) may be practiced at block 210. In the example illustrated in FIGS. 3A and 3B, FEOL circuitry 380 includes peripheral logic circuitry of an embedded memory that includes field effect transistors (FETs) 381. CMOS FET circuitry implementing host integrated circuitry (not depicted) may be anywhere laterally adjacent to the peripheral logic circuitry of the embedded memory, but within the same plane as FETs 381.

FETs 381 employ monocrystalline semiconductor material for at least the channel semiconductor 371. FETs 381 further include a gate terminal 370 separated from channel semiconductor 371 by a gate insulator 372 Channel semiconductor 371 separates semiconductor terminals 310 (source semiconductor and drain semiconductor). Contact metallization 375 lands on semiconductor terminals 310 and is separated from gate terminal 370 by an intervening insulator 377. FETs 381 may be planar or non-planar devices. In some advantageous embodiments, FETS 381 are finFETs.

FEOL circuitry 380 further includes one or more initial levels of interconnect metallization 305 embedded in dielectric materials 303, 304. In the exemplary embodiment illustrated, FEOL circuitry 380 includes metal-one ($M_1$), metal-two ($M_2$) metal-three ($M_3$), metal-four ($M_4$) and metal-five ($M_5$) levels interconnecting FETs 381. In the example, metal-five implements wordline 10.

Returning to FIG. 2, methods 200 continue at block 220 where access transistors are fabricated over the FEOL circuitry, within BEOL layer. In some embodiments, block 220 comprises fabricating TFTs. In some exemplary embodiments, the TFTs are planar channel devices, fin channel devices, or as further described below, recessed channel devices. In the example illustrated in FIG. 3A, a plurality of TFTs 382 is located over FEOL circuitry 380. As shown, all TFTs 382 employ portions of thin film semiconductor material 302, which is an amorphous or polycrystalline film that may extend across, and/or between, all TFTs 382, or comprise a plurality of physically separated islands. 1T-1F bit-cell 301 is denoted by dot-dashed line in FIG. 3A and FIG. 3B. Individual ones of TFTs 382 include a gate terminal (electrode) 318 separated from semiconductor material 302 by a gate insulator 320. In the exemplary embodiment illustrated, TFTs 382 are "bottom-gate" devices with semiconductor material 302 deposited over gate terminal 318. Alternatively, top-gate architectures are also possible where at least gate terminal 318 is above semiconductor material 302. Terminal contact metallization 340 lands on source and drain regions of semiconductor material 302.

Semiconductor material 302 may be a group IV semiconductor material, such as silicon (Si), germanium (Ge), and SiGe alloys. However, in some exemplary embodiments, semiconductor material 302 comprises an oxide semiconductor, or semiconducting oxide, or a semiconductor, comprising a metal and oxygen. Many metal oxide semiconductor materials have a wide band gap oxide channel material offering low leakage. With essentially no minority carriers, majority-minority carrier recombination cannot generate significant off-state leakage current. Through low-leakage, TFTs 382 may enable higher retention rates at higher memory density and, as described further below, enhance performance of a 1T-1F cell further including a low-leakage ferroelectric capacitor.

An oxide semiconductor thin film can be amorphous (i.e., having no structural order), or polycrystalline (e.g., having micro-scale to nano-scale crystal grains). Exemplary metal oxides include a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Semiconductor material 302 may be a p-type, n-type, or intrinsic material. In exemplary embodiments, semiconductor material 302 is n-type as many oxide semiconductors have been found to be capable of significant electron densities. In some embodiments, semiconductor material 302 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, semiconductor material 302 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, semiconductor material 302 comprises titanium oxide ($TiO_x$), or $SnO_x$.

Semiconductor material 302 or various portions thereof, may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H), and/or oxygen vacancies. In some embodiments where semiconductor material 302 comprises $ZnO_x$, the dopants may include In and Ga. In some specific examples, semiconductor material 302 is $InGaO_3(ZnO)_5$, often referred to simply as IGZO.

Access transistors are coupled to a memory device bitline comprising an interconnect metallization trace within a BEOL metallization level $M_6$, above TFTs 382. Memory device bitline may alternatively comprise an interconnect metallization within a metallization level $M_5$, below TFTs 382. As further shown in FIG. 3A and FIG. 3B, metal line 348 provides bitline connection to contact metallization 340 landing on semiconductor terminals (e.g., drain semiconductor) of access transistors. Source terminals of access transistors are electrically connected to capacitor storage node interconnect metallization 349. Storage node interconnect metallization 349 is adjacent to, but electrically insulated from, the bitline, and in this example includes a $M_6$ line and an overlying via.

Returning to FIG. 2, methods 200 continue at block 230 where double-walled FE capacitors are formed within a BEOL level over the access transistors. Operations performed at block 230 to form ferroelectric material on both an inner and outer conductor sidewall are described in more detail elsewhere herein. As shown in FIG. 3A and FIG. 3B, each storage node interconnect metallization 349 electrically couples a first conductive capacitor conductor structure 360 with a semiconductor terminal (e.g., source semiconductor) of one access transistor 35. Double-walled FE capacitors 20 further include another conductor material 362 that is separated from conductor structure 360 by an intervening ferroelectric material 361. In the exemplary embodiment shown, conductor material 362 is continuous across at least all double-walled FE capacitors 20 associated with one bitline 6. In alternative embodiments, conductor material 362 may also be continuous across FE capacitors 20 associated with multiple bitlines and a single wordline.

Ferroelectric material 361 advantageously has a higher relative permittivity than high-K dielectric materials that lack the spontaneous polarization of materials in a ferroelectric phase (orthorhombic, non-centrosymmetric crystallinity). For example, a high-k dielectric comprising predominantly hafnium and oxygen ($HfO_x$), but not in a ferroelectric phase, may have a relative permittivity in the range of 10-14. However, hafnium oxide in a ferroelectric phase may have a relative permittivity exceeding 25 (e.g., 30). Although in both instances the $HfO_x$ comprises predominantly hafnium and oxygen, ferroelectric material 361 is more specifically a ferroelectric phase of the hafnium oxide. Such phases may be achieved, for example, through the addition of a dopant, such as silicon, germanium, aluminum, or yttrium. Although ferroelectric $HfO_x$ is an exemplary embodiment, ferroelectric material 361 may also have other compositions amenable to being deposited at temperatures similarly compatible with BEOL structures and offering similar thickness conformality.

As further illustrated in FIG. 3A and FIG. 3B, ferroelectric capacitors are double-walled with ferroelectric material 361 lining both an interior surface and exterior surface of capacitor conductor structure 360. In exemplary embodiments where capacitor conductor structure 360 is substantially cylindrical (e.g., a right cylinder that is open at the top), ferroelectric material 361 line both an interior sidewall of the cylinder and an exterior sidewall of the cylinder. Capacitor conductor material 362 is adjacent to the ferroelectric material 361, likewise lining an interior sidewall of the cylinder and an exterior sidewall of the cylinder.

Returning to FIG. 2, methods 200 end at output 240 where BEOL interconnect of the embedded memory array and/or the underlying FET circuitry is completed. For example, as shown in FIG. 3A and FIG. 3B, a common plate reference potential may be supplied through circuit node 25 implemented in another metallization level (e.g., $M_7$) coupled to capacitor conductor material 362.

Figure 4A:
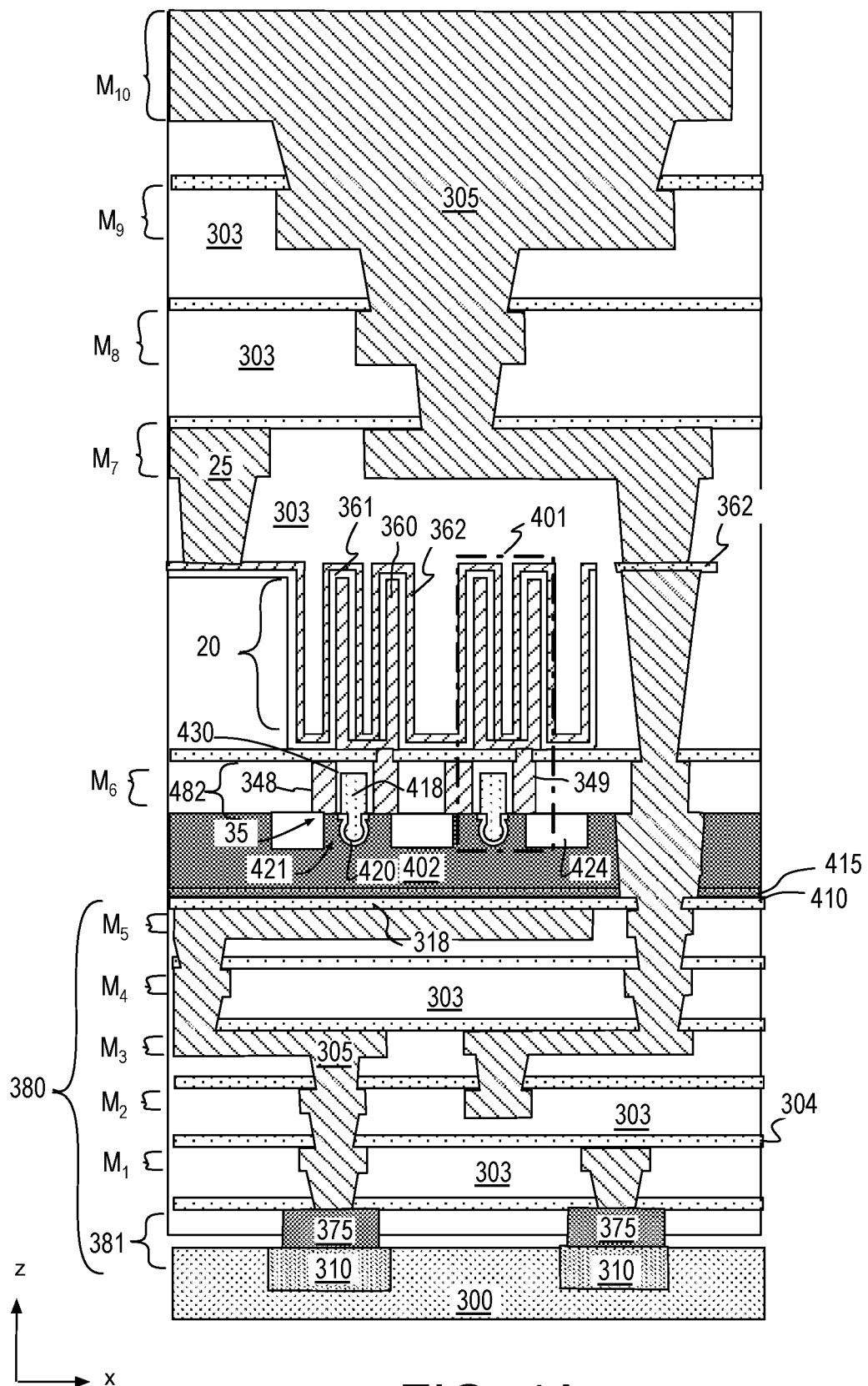
FIG. 4A illustrates a cross-sectional side view of the IC illustrated in FIG. 1, in accordance with some exemplary embodiments with a recessed channel array transistor (RCAT) in the bit-cell.
Figure 4B:
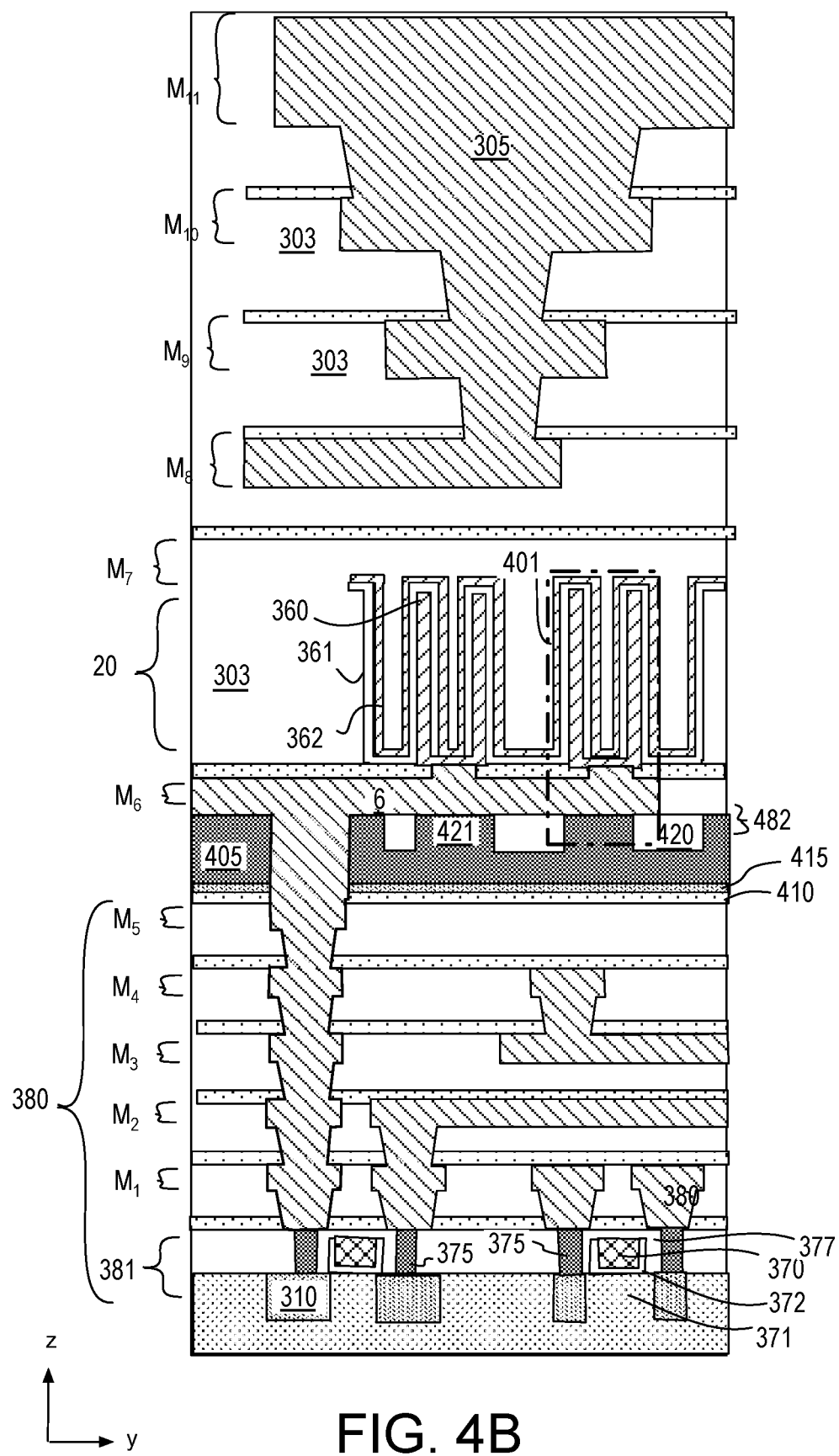
FIG. 4B illustrates a cross-sectional side view of the IC illustrated in FIG. 4A, in accordance with some exemplary embodiments with a recessed channel array transistor (RCAT) in the bit-cell.

In accordance with some further embodiments, access transistors may have an RCAT architecture. FIGS. 4A and 4B illustrate orthogonal cross-sectional side views of an IC structure that is a portion of the IC 100 illustrated in FIG. 1, in accordance with some exemplary embodiments, which include a recessed channel array transistor (RCAT) in bit-cell 401. In both FIG. 4A and FIG. 4B, reference numbers from FIG. 3 are retained for structures that may have any of the same properties described for like structures introduced in FIGS. 3A and 3B. As shown in FIG. 4A and FIG. 4B, an IC structure again includes FEOL circuitry 380 and double-walled ferroelectric capacitors 20. However, instead of TFTs the illustrated IC structure includes RCATs 482. RCATS 482 have a channel recessed into semiconductor material. In the illustrated example, semiconductor material 402 is monocrystalline rather than a deposited thin film. Semiconductor material 402 may, for example, be a layer transferred from a donor substrate and bonded to a bonding interface material 410 of FEOL circuitry. Any bonding process (e.g., hybrid, or otherwise) may be employed in the layer transfer process as embodiments are not limited in this respect. Semiconductor material 402 may also have a bonding interface material 415. Semiconductor material 402 is also therefore illustrated as being relatively thicker than semiconductor material 302 (FIG. 3). However, the thickness of semiconductor material 402 may vary with implementation, for example from hundreds of nanometers to a hundred micrometers, or more.

Semiconductor material 402 may have any composition suitable for transistors, such as monocrystalline variants of any of the compositions listed above for semiconductor material 402. In some exemplary embodiments, semiconductor material 402 comprises predominantly silicon (e.g., substantially pure Si) material, predominantly germanium (e.g., substantially pure Ge) material, or a compound material comprising a Group IV majority constituent (e.g., SiGe alloys, GeSn alloys). At least a top layer of semiconductor material 402 may be impurity doped, for example to either n-type or p-type, with any electrically active species. Noting that impurity activation may require high temperatures (e.g., 800° C.), which exceed the tolerance of various structures within FEOL circuitry 380, such high temperature processing may be performed prior to transferring semiconductor material 402 from the donor substrate. Likewise, any of the structural features of RCATs 482 may be fabricated prior to transferring semiconductor material 402 to FEOL circuitry 380. Any of the structural features of RCATs 482 not requiring high temperatures may also be fabricated after bonding semiconductor material 402 to FEOL circuitry 380.

FIG. 4A and FIG. 4B further illustrate RCATs 482 and double-walled ferroelectric capacitors 20. RCATs 482 each include a portions of semiconductor material 402. Individual ones of RCATs 482 further include a gate terminal (electrode) 418 separated from semiconductor layer 402 by a gate insulator 420. In the exemplary embodiment illustrated, RCATs 482 are "spherical" RCATs (S-RCATs) where semiconductor material has been isotropically etched and back-filled with a liner of gate insulator 420 and gate terminal 418. In the illustrated embodiment, each RCAT 482 is includes a non-planar "fin" body 421 separated from adjacent fins by isolation dielectric 424. A portion of the fin is recessed to form the channel topography. A spacer insulator 430 separates a sidewall of gate terminal 418 from semiconductor terminal contact metallization 340, which lands on impurity-doped source and drain regions of semiconductor material 402 (which were annealed prior to bonding).

In some embodiments, a 1T-1F bit-cell includes thin film RCATs, which, for example, combine attributes of both TFTs 382 and RCATs 482. For such embodiments, the RCAT structural features illustrated in FIG. 4A and FIG. 4B are implemented in a thin film semiconductor layer, which may be amorphous or polycrystalline and have any of the compositions described above for semiconductor material 302 (FIG. 3). Thin film semiconductor layer may be deposited to a thickness sufficient to accommodate a desired channel recess.

In some embodiments, the FETs 381 (FIG. 4A and FIG. 4B) are RCATs including structural features similar to those of RCATs 482. For such embodiments, both FEOL circuitry 380 and access transistors 35 may be RCATs. Alternatively, only FEOL circuitry 380 may comprise RCATs while access transistors are TFTs.

Figure 5:
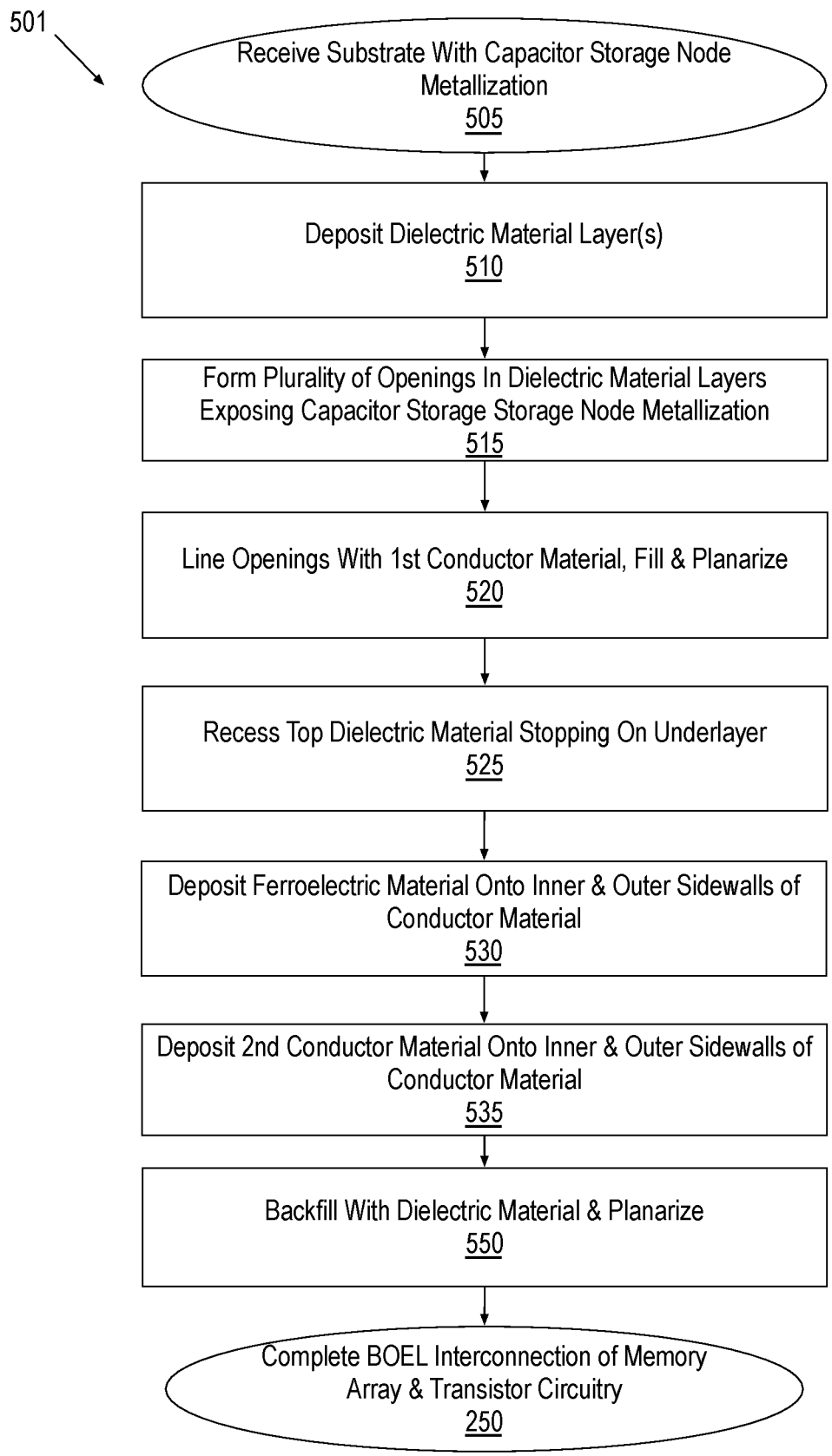
FIG. 5 is a flow diagram illustrating methods of fabricating double-walled ferroelectric capacitors, in accordance with some embodiments.

FIG. 5 is a flow diagram illustrating methods 501 for fabricating double-walled ferroelectric capacitors, in accordance with some embodiments. Methods 501 may be practiced to form capacitors 20 (FIG. 3A-B, FIG. 4A-B), for example. Methods 501 begin at input 505 with receipt of a substrate including capacitor storage node interconnect metallization embedded in a planarized dielectric. At block 510, one or more dielectric material layers are deposited with any deposition process suitable for the material(s). At block 515, a plurality of via openings are formed through the dielectric material layers, exposing at least a portion of the capacitor storage node interconnect metallization at a bottom of the opening.

Figure 6:
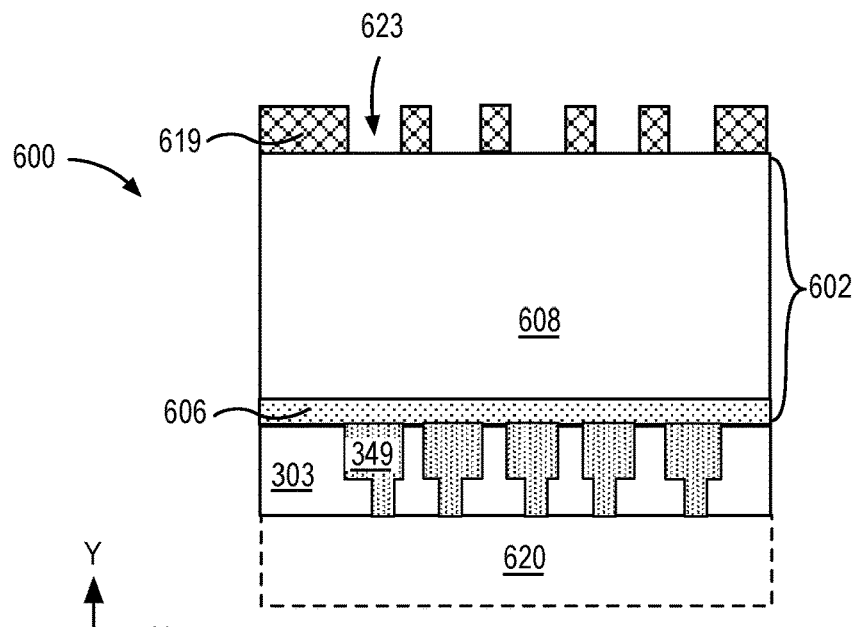
FIGS. 6 and 7A illustrate a cross-sectional view of a portion of a capacitor array evolving as selected operations in the methods introduced in FIG. 5 are practiced, in accordance with some embodiments.
Figure 7A:
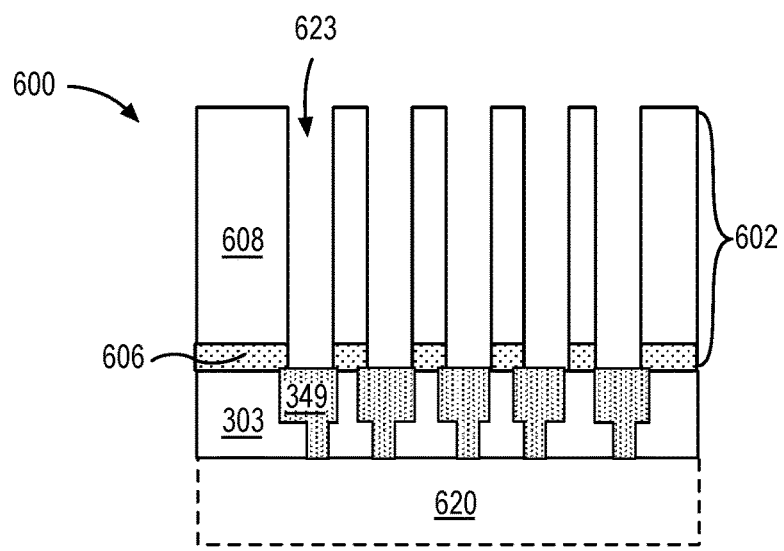

FIGS. 6 and 7A illustrate cross-sectional views of a portion of a capacitor array 600 evolving as blocks 510 and 515 are practiced, in accordance with some embodiments. As shown in FIG. 6, capacitor storage node interconnect metallization 349 is over a substrate 620. Substrate 620 includes FEOL circuitry and is illustrated with dashed line as it further includes any of the TFT and/or RCAT access transistors described above. A dielectric material stack 602 is deposited over capacitor storage node interconnect metallization 349. Dielectric material stack 602 may include any number of layers of any known dielectric materials. In the illustrated examples, a dielectric material 608 is over another dielectric material 606. Although the compositions may vary, in some examples dielectric material 608 is predominantly silicon and oxygen (e.g., $SiO_x$) while dielectric material 606 comprises predominantly silicon and nitrogen (e.g., SiN$_x$) A mask 619 over dielectric material stack 602 defines via openings 623.

Figure 7B:
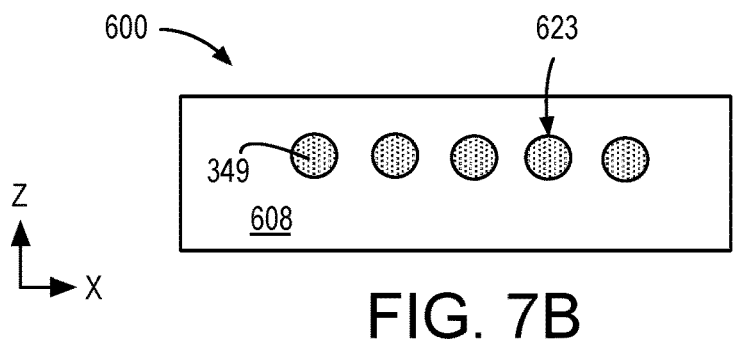
FIG. 7B illustrates a top down plan view of a portion of the capacitor array illustrated in FIG. 7A, in accordance with some embodiments.

In FIG. 7A, via openings 623 are etched through both dielectric material 608 and dielectric material 606, exposing capacitor storage node interconnect metallization 349. FIG. 7B illustrates a top down plan view of portion of capacitor array 600, in accordance with some embodiments. As shown, via openings 623 have a substantially round footprint.

Figure 8A:
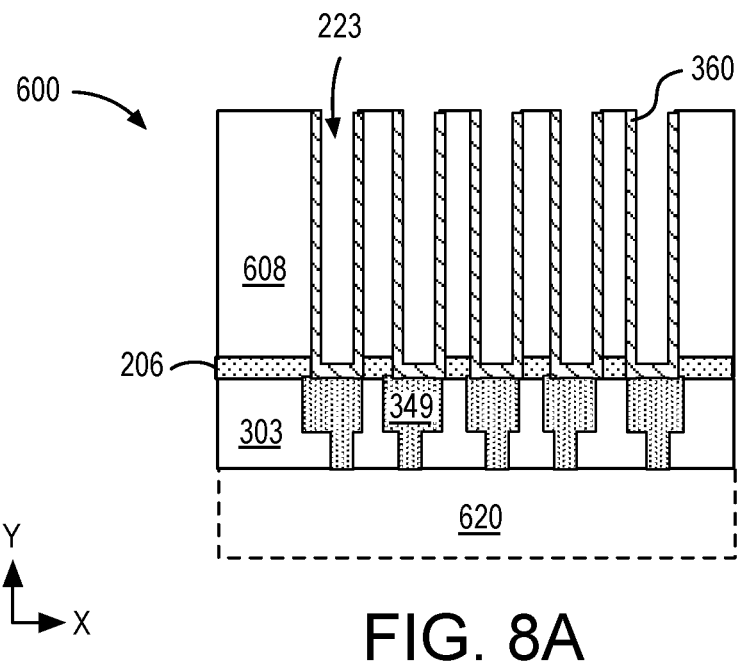
FIG. 8A illustrates a cross-sectional view of a portion of the capacitor array illustrated in FIG. 7A evolving as selected operations in the methods introduced in FIG. 5 are practiced, in accordance with some embodiments.
Figure 8B:
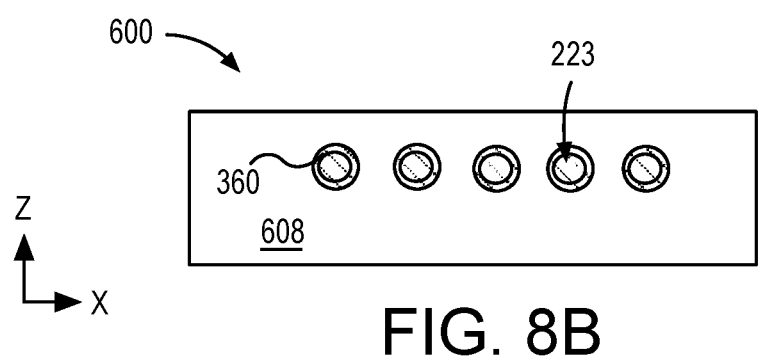
FIG. 8B illustrates a top-down plan view of a portion of the capacitor array illustrated in FIG. 8A, in accordance with some embodiments.

Returning to FIG. 5, methods 501 continue at block 520 where the openings are lined with a first conductor material, which is then backfilled with a sacrificial material and planarized. In exemplary embodiments, the first conductor material is deposited by CVD, and more advantageously with a low temp (e.g., <450° C.) ALD process. As shown in the example of FIG. 8A, conductor structure 360 has been conformally deposited upon sidewalls of dielectric material 608, forming a cylinder. While conductor structure 360 may be a variety of metals and metalloids, in some embodiments conductor structure 360 comprises metal and nitrogen (e.g., TiN). Such films, when deposited by ALD, are low stress, allowing them to stand freely with minimal support from surrounding materials. To isolate each cylinder, a sacrificial material (not depicted) is deposited into conductor structure 360 and a planarization process performed to exposing dielectric material 608 between each cylinder. The sacrificial material is removed to arrive at the structure illustrated in FIG. 8A and FIG. 8B.

Figure 9:
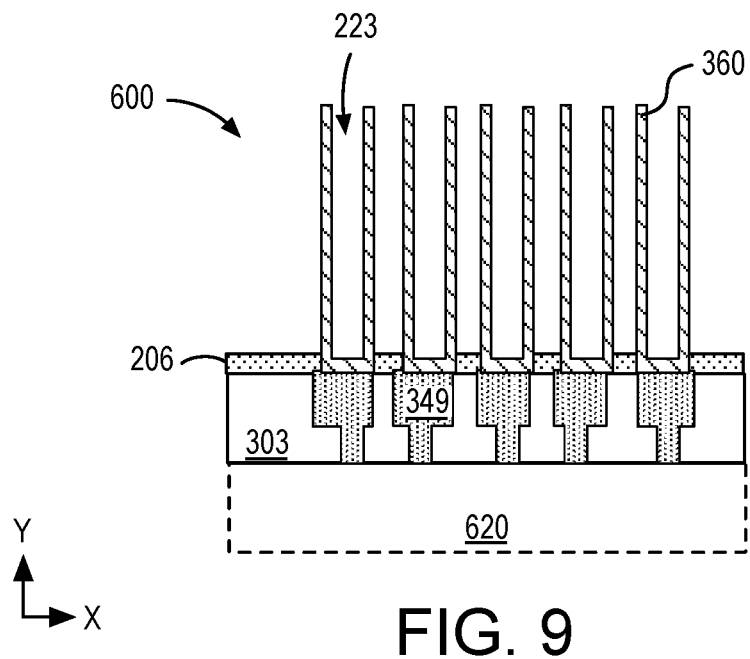
FIGS. 9 and 10A illustrate a cross-sectional view of a portion of the capacitor array of FIG. 8A evolving as operations in the methods introduced in FIG. 5 are practiced, in accordance with some embodiments.

Returning to FIG. 5, methods 501 continue at block 525 where the dielectric material surrounding the cylindrical conductor structures is recessed, for example, with an etch that is sufficiently selective to stop on the underlying dielectric material. As shown in FIG. 9, dielectric material 208 has been completely removed from the illustrated portion of capacitor array 600 where an etch process was not masked.

Figure 10A:
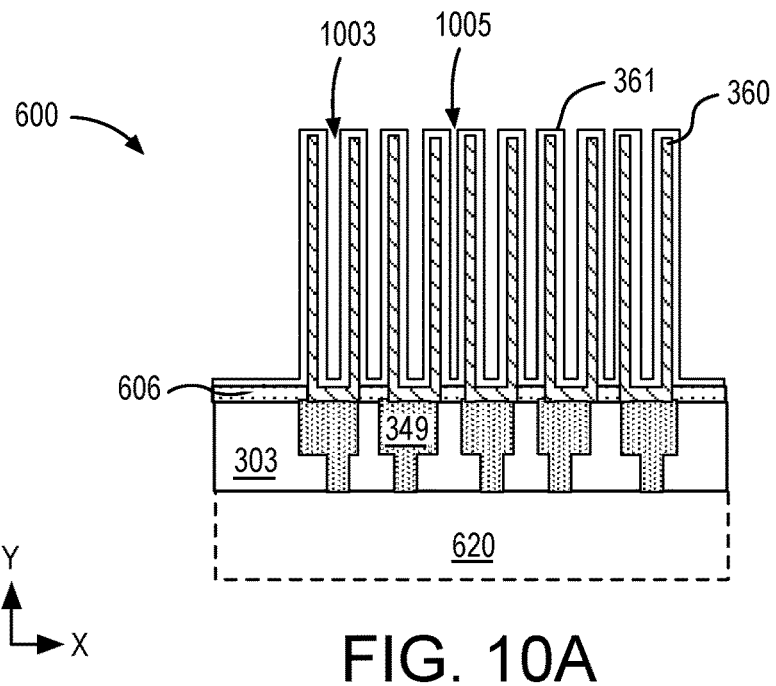
Figure 10B:
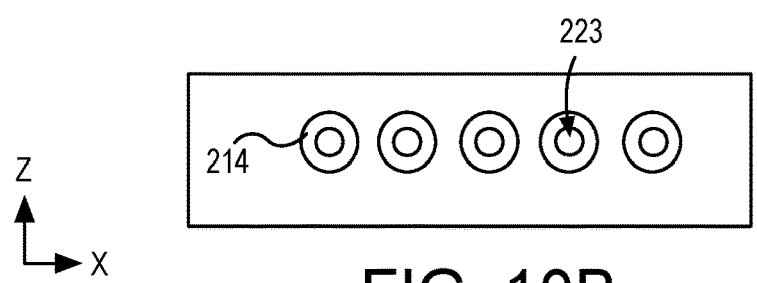
FIG. 10B illustrates a top-down plan view of a portion of the capacitor array illustrated in FIG. 10A, in accordance with some embodiments.

Methods 501 (FIG. 5) continue at block 530 where a ferroelectric material is deposited over and/or upon the free-standing conductor material. In exemplary embodiments, the ferroelectric material is conformally deposited with a low temp (e.g., <450° C.) ALD process. FIG. 10A illustrates a cross-sectional view of a portion of capacitor array 600 following deposition of ferroelectric material 361. As shown ferroelectric material 361 is in direct contact with conductor structure 360, covering both inner sidewalls 1003 and outer sidewalls 1005 of each cylinder, thereby doubling the wall surface area. FIG. 10B further illustrates a top down plan view of a portion of the capacitor array 600.

Figure 11:
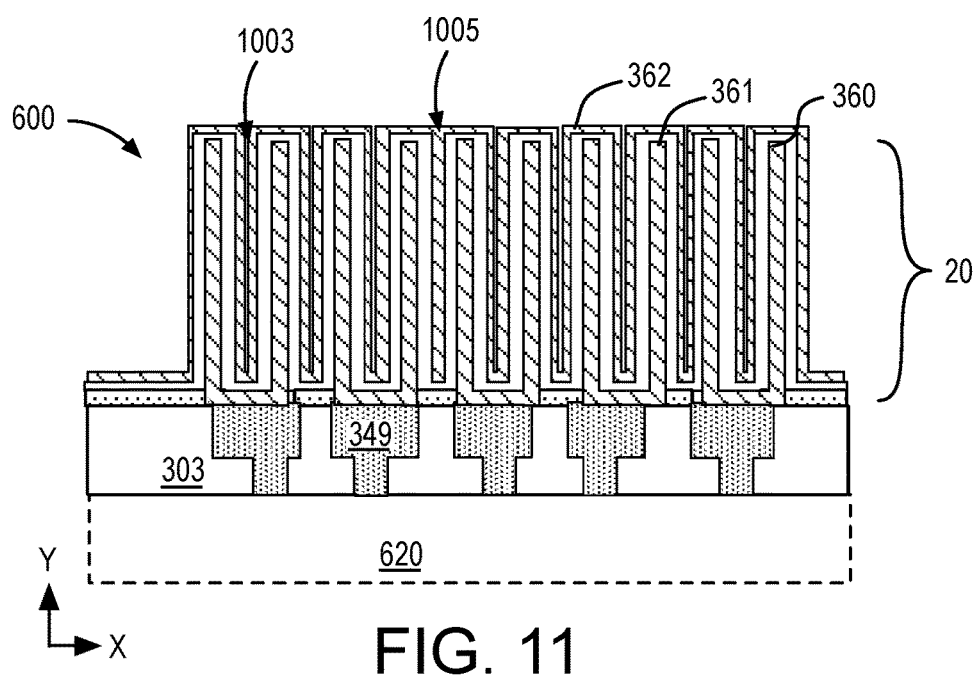
FIG. 11 illustrates a cross-sectional view of a portion of the capacitor array of FIG. 10A evolving as operations in the methods introduced in FIG. 5 are practiced, in accordance with some embodiments.

Returning to FIG. 5, methods 501 continue at block 535 where another conductor material is deposited upon the ferroelectric material. In exemplary embodiments, the conductor material is advantageously deposited with a low temp (e.g., <450° C.) ALD process. As shown in the example of FIG. 11, conductor material 362 has been conformally deposited upon inner sidewalls 1003 of each cylinder and upon outer sidewalls 1005 of each cylinder. While conductor material 362 may be a variety of metals and metalloids, in some embodiments conductor material 362 has the same composition as conductor material 360, and may, for example comprise metal and nitrogen (e.g., TiN). In exemplary double-walled embodiments, conductor material 362 lines, or clads, both sidewalls 1003 and 1005 doubling the wall surface area.

Methods 501 (FIG. 5) continue at block 550 where the capacitor array topography is backfilled with any suitable gap filling dielectric material, and planarized in preparation for further BEOL processing. Methods 501 end at output 250 where BEOL interconnect of the embedded memory array and transistor circuitry to complete the IC.

Figure 12:
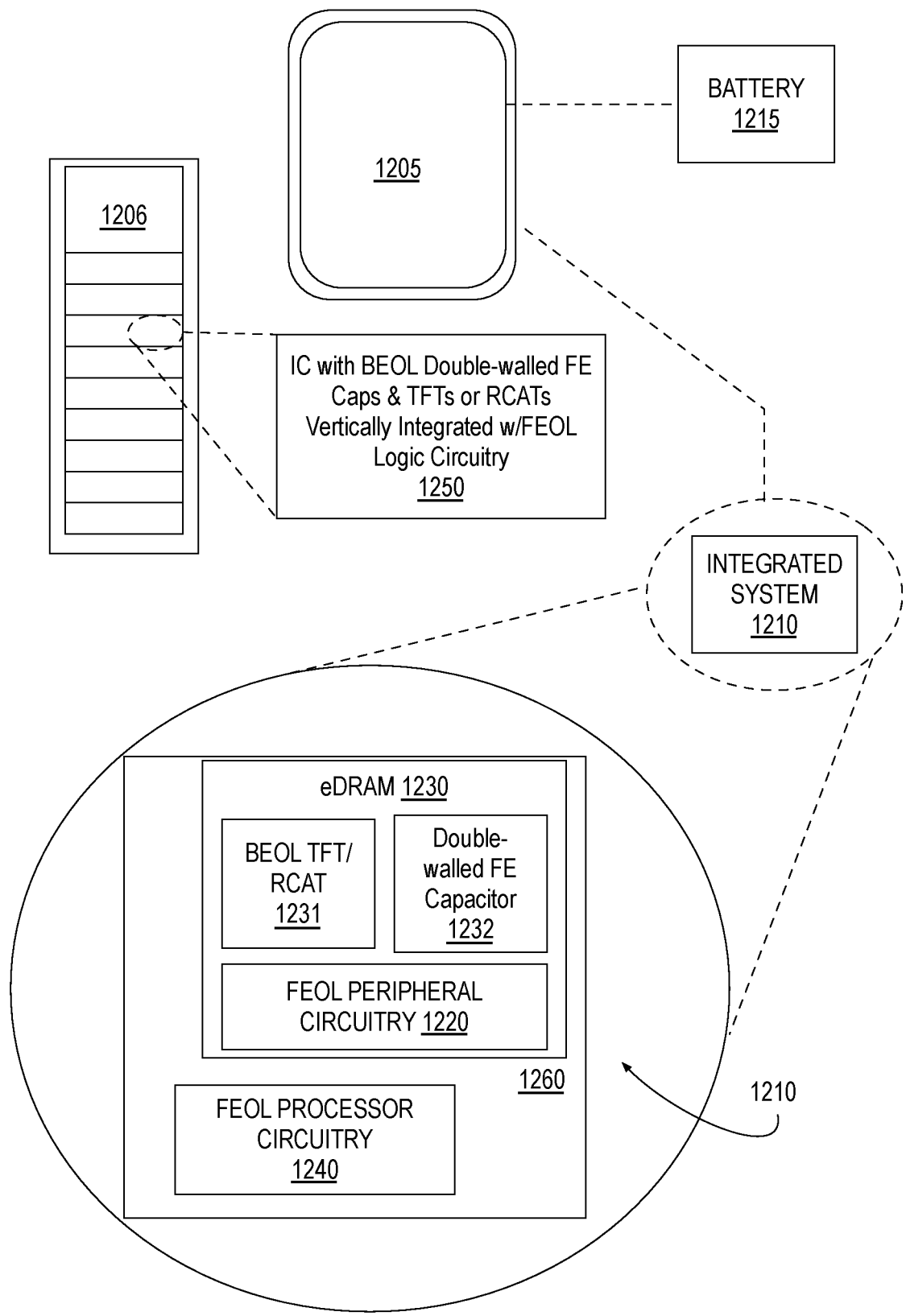
FIG. 12 illustrates a mobile computing platform and a data server machine employing an IC with embedded memory including a double-walled ferroelectric capacitor, in accordance with some embodiments.

FIG. 12 illustrates a mobile computing platform 1205 and a data server machine 1206 employing one or more integrated circuits with BEOL FE capacitors and TFT and/or RCAT access transistors vertically integrated with FEOL logic circuitry, for example as described elsewhere herein. Server machine 1206 may be any commercial server, for example including any number of high-performance computing platforms disposed within a rack and networked together for electronic data processing, which in the exemplary embodiment includes an IC 1250 with BEOL FE capacitors and TFT and/or RCAT access transistors vertically integrated with FEOL logic circuitry, for example as described elsewhere herein. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), an integrated system 1210, and a battery 1215.

As illustrated in the expanded view 1210, a IC 1260 includes FEOL processor circuitry 1240 and eDRAM 1230. eDRAM 1230 further includes FEOL peripheral circuitry 1220, BEOL TFT and/or RCAT access transistors 1231 and double-walled FE capacitors 1232, for example as described elsewhere herein.

Figure 13:
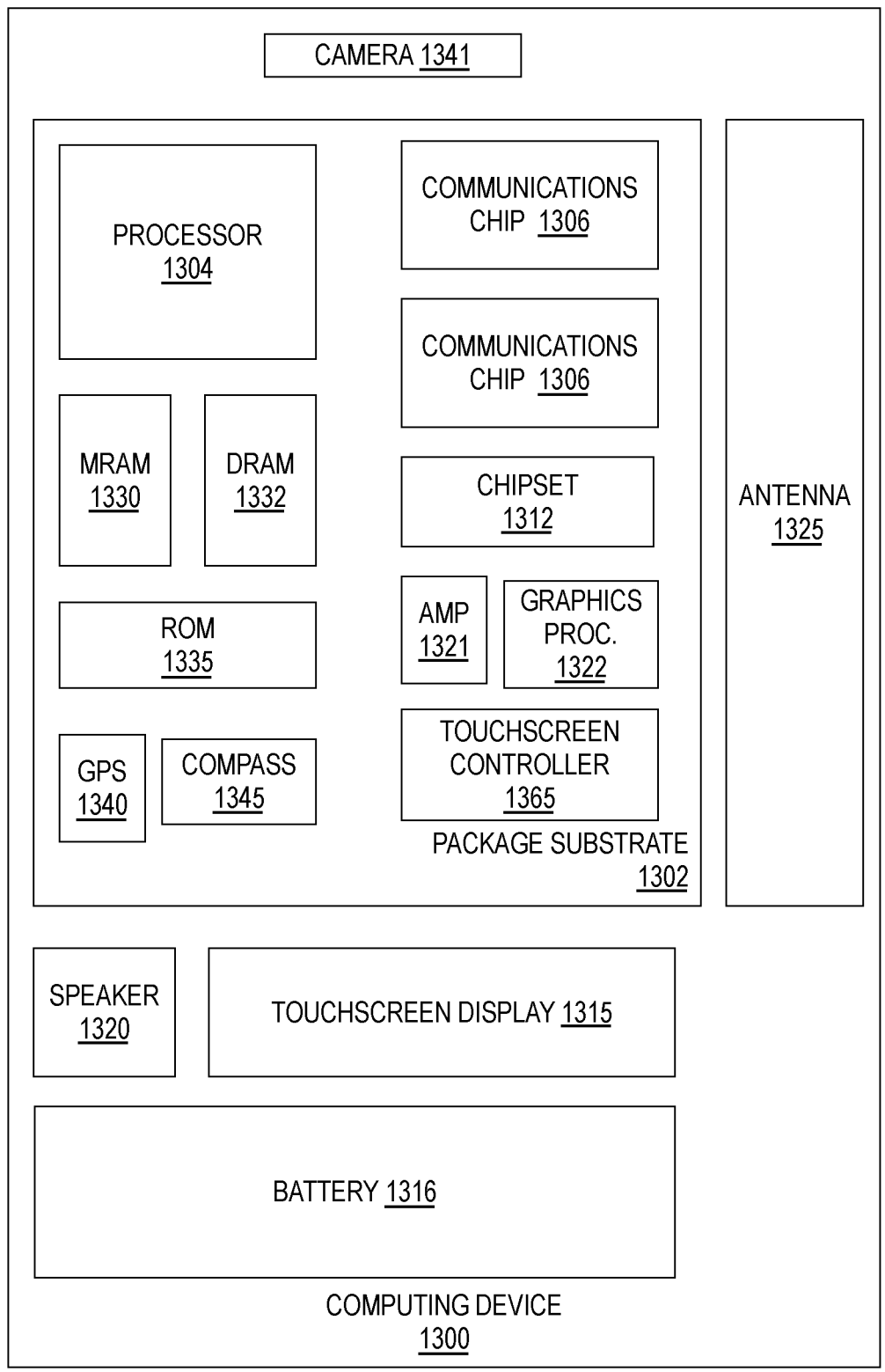
FIG. 13 is a functional block diagram of an electronic computing device, in accordance with some embodiments.

FIG. 13 is a functional block diagram of an electronic computing device 1300, in accordance with an embodiment of the present invention. Computing device 1300 may be found inside either mobile platform 1205 or server machine 12006, for example Device 1300 further includes a host substrate 1302 hosting a number of components, such as, but not limited to, a processor 1304 (e.g., an applications processor). Processor 1304 may be physically and/or electrically coupled to host substrate 1302. In some examples, processor 1304 comprises one or more integrated circuits with BEOL FE capacitors and TFT and/or RCAT access transistors vertically integrated with FEOL logic circuitry for example as described elsewhere herein. Processor 1304 may be implemented with circuitry in any or all of the IC die of the composite IC die package. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the host substrate 1302. In further implementations, communication chips 1306 may be part of processor 1304. Depending on its applications, computing device 1300 may include other components that may or may not be physically and electrically coupled to host substrate 1302. These other components include, but are not limited to, volatile memory (e.g., DRAM 1332), non-volatile memory (e.g., ROM 1335), flash memory (e.g., NAND or NOR), magnetic memory (MRAM 1330), a graphics processor 1322, a digital signal processor, a crypto processor, a chipset 1312, an antenna 1325, touchscreen display 1315, touchscreen controller 1365, battery 1316, audio codec, video codec, power amplifier 1321, global positioning system (GPS) device 1340, compass 1345, accelerometer, gyroscope, speaker 1320, camera 1341, and mass storage device (such as hard disk drive, solid-state drive (SSD), compact disk (CD), digital versatile disk (DVD), and so forth), or the like. In some exemplary embodiments, at least one of the components of device 1300 comprises one or more integrated circuits with BEOL FE capacitors and TFT or RCAT access transistors vertically integrated with FEOL logic circuitry, for example as described elsewhere herein.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die comprises a plurality of first transistors with monocrystalline channel material, one or more first levels of metallization over the first transistors, and a memory array structure over the first levels of metallization. The memory array structure comprises a plurality of double-walled ferroelectric capacitors, and a plurality of second transistors between the ferroelectric capacitors and the first levels of metallization. The IC die further comprises one or more second levels of metallization over the memory array structure.

In second examples, for any of the first examples individual ones of the double-walled ferroelectric capacitors comprise a ferroelectric material adjacent to an inner sidewall of a first conductor structure and adjacent to an outer sidewall of the first conductor structure.

In third examples, for any of the second examples the ferroelectric material has a relative permittivity over 25.

In fourth examples, for any of the third or fourth examples the ferroelectric material comprises predominantly Hf, 0, and one or impurity dopants.

In fifth examples, for any of the fourth examples the impurity dopants comprise at least one of Si or Ge.

In sixth examples, for any of the second through fifth examples the first conductor structure is a cylinder.

In seventh examples, for any of the first through sixth examples the second transistors are recessed channel array transistors (RCATs).

In eighth examples, for any of the seventh examples the RCATs have monocrystalline channel material.

In ninth examples, for any of the seventh or eighth examples the RCATs have amorphous or polycrystalline channel material.

In tenth examples, for any of the first sixth examples the second transistors are thin film transistors (TFTs) with monocrystalline channel material.

In eleventh examples, for any of the tenth examples, the channel material comprises predominantly one or more metals and oxygen.

In twelfth examples, for any of the tenth or eleventh examples the channel material comprises at least one of In, Ga, or Zn.

In thirteenth examples, a system comprises an integrated circuit (IC) die comprising a plurality of first transistors with monocrystalline channel material, one or more first levels of metallization over the first transistors, and a memory array structure over the first levels of metallization. The memory array structure comprises a plurality of double-walled ferroelectric capacitors. The IC die further comprises a plurality of second transistors between the ferroelectric capacitors and the first levels of metallization, and one or more second levels of metallization over the first transistors. The system comprises a power supply coupled to the IC to power to the IC.

In fourteenth examples, for any of the thirteenth examples the IC die includes at least one of microprocessor core circuitry or floating point gate array (FPGA) circuitry.

In fifteenth examples, a method of fabricating an integrated circuit (IC) die comprises forming a plurality of first transistors with monocrystalline channel material, forming one or more first levels of metallization over the first transistors, and forming a memory array structure over the first levels of metallization. Forming the memory array structure comprises forming a plurality of second transistors, forming a plurality of first conductor structures over the second transistors, wherein individual ones of the conductor structures are coupled to a terminal of the second transistors, depositing a ferroelectric material over the first conductor structures and in contact with both an inner and outer sidewall of the first conductor structures, and depositing a second conductor material over the ferroelectric material clad first conductor structures. The method further comprises forming one or more second levels of metallization over the memory array structure.

In sixteenth examples, for any of the fifteenth examples depositing the ferroelectric material comprises atomic layer deposition of a material comprising predominantly hafnium and oxygen.

In seventeenth examples, for any of the fifteenth through sixteenth examples forming the second transistors further comprises bonding a monocrystalline semiconductor material to a planar top surface of the first levels of metallization, and forming recessed channel array transistors (RCATs) comprising a portion of the monocrystalline semiconductor material.

In eighteenth examples, for any of the fifteenth through seventeenth examples forming the second transistors further comprises depositing an amorphous or polycrystalline semiconductor material over a planar top surface of the first levels of metallization.

In nineteenth examples, for any of the eighteenth examples depositing the amorphous or polycrystalline semiconductor material comprises depositing IGZO.

In twentieth examples, for any of the eighteenth through nineteenth examples forming the second transistors further comprises forming RCATs comprising a portion of the amorphous or polycrystalline semiconductor material.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die, comprising:
   a processor core comprising a plurality of first transistors with monocrystalline channel material;
   one or more first levels of metallization over the first transistors;
   an embedded dynamic random access memory (eDRAM) array structure over the first levels of metallization, wherein the eDRAM array structure comprises cells, each of the cells comprising:
      a double-walled ferroelectric capacitor, wherein the double-walled ferroelectric capacitor comprises a ferroelectric material adjacent to an inner sidewall of a first conductor structure and adjacent to an outer sidewall of the first conductor structure; and
      an access transistor between the double-walled ferroelectric capacitor and the first levels of metallization, wherein the access transistor is a recessed channel array transistor (RCAT) comprising:
         a channel material comprising one or more metals and oxygen; and
         a source or drain terminal coupled to the first conductor structure; and
   one or more second levels of metallization over the eDRAM array structure.

2. The IC die of claim 1, wherein the ferroelectric material has a relative permittivity over 25.

3. The IC die of claim 2, wherein the ferroelectric material comprises predominantly Hf, O, and one or impurity dopants.

4. The IC die of claim 2, wherein the impurity dopants comprise at least one of Si or Ge.

5. The IC die of claim 1, wherein the first conductor structure is a cylinder.

6. A system comprising:
   the integrated circuit (IC) die of claim 1; and
   a power supply coupled to the IC to power to the IC.

7. The IC die of claim 1, wherein the channel material comprises In, Ga, and Zn.

8. The IC die of claim 1, wherein the RCAT is a spherical RCAT (S-RCAT).

9. The IC die of claim 1, wherein the RCAT comprises a non-planar fin of the channel material, a portion of the fin is recessed, and a gate electrode is within the recess.

10. The IC die of claim 1, wherein the access transistor has an area matched to that of the double-walled ferroelectric capacitor.

11. A method of fabricating an integrated circuit (IC) die, the method comprising:
    forming a processor core comprising a plurality of first transistors with monocrystalline channel material;
    forming one or more first levels of metallization over the first transistors;
    forming an embedded dynamic random access memory (eDRAM) array structure over the first levels of metallization, wherein forming the memory (eDRAM) array structure comprises:
       forming a cell access transistor, wherein forming the cell access transistor further comprises:
          depositing a film of semiconductor material comprising oxygen and one or more metals over the first levels of metallization; and
          forming a recessed channel array transistor (RCAT) comprising a portion of the semiconductor material comprising oxygen and one or more metals;
       forming a cell double-walled ferroelectric capacitor, wherein forming the double-wall ferroelectric capacitor further comprises:
          forming a first conductor structure over the access transistor, wherein the first conductor structure is coupled to a terminal of the cell access transistor;
          depositing a ferroelectric material over the first conductor structure and in contact with both an inner and outer sidewall of the first conductor structure; and
          depositing a second conductor material over the ferroelectric material clad first conductor structure; and
    forming one or more second levels of metallization over the memory array structure.

12. The method of claim 11, wherein depositing the ferroelectric material comprises atomic layer deposition of a material comprising predominantly hafnium and oxygen.

13. The method of claim 11, wherein depositing the semiconductor material comprises depositing a compound comprising oxygen, In, Ga, and Zn.

* * * * *